United States Patent [19]

Ikeda

[11] Patent Number: 5,135,635
[45] Date of Patent: Aug. 4, 1992

[54] SPUTTERING APPARATUS

[75] Inventor: Jiro Ikeda, Shizuoka, Japan

[73] Assignee: Sony Corporation, Tokyo, Japan

[21] Appl. No.: 677,766

[22] Filed: Mar. 29, 1991

[30] Foreign Application Priority Data

Mar. 30, 1990 [JP] Japan .................................... 2-83793
Mar. 30, 1990 [JP] Japan .................................... 2-83795

[51] Int. Cl.⁵ ............................................. C23C 14/56
[52] U.S. Cl. ........................... 204/298.25; 204/298.35;
118/719; 118/729; 118/730; 118/731; 414/217;
414/222; 414/225
[58] Field of Search ....................... 204/298.25, 298.35;
118/728-713, 719; 414/217, 222, 223, 225

[56] References Cited

U.S. PATENT DOCUMENTS 4,820,106  4/1989  Walde et al. ......................... 414/217

FOREIGN PATENT DOCUMENTS 291690   11/1988  European Pat. Off. ............ 414/217
2252419  6/1975   France ............................ 204/298.25
2-80569  3/1990   Japan ............................. 204/298.35

Primary Examiner—Aaron Weisstuch
Attorney, Agent, or Firm—Hill, Van Santen, Steadman & Simpson

[57] ABSTRACT

The sputtering apparatus for the present invention is used for manufacturing optical discs. On loading and unloading of disc substrates to and from a vacuum chamber, a disc entrance and exit opening provided on the vacuum chamber is closed by a tray having an opening at the center thereof on which the disc substrate is placed and a push up rod having a closing side closing the opening of the tray on the lower side thereof. Sealing of the disc entrance and exit opening may be made positive and the vacuum chamber is uniformly evacuated so that an excellent sputtering can be performed.

15 Claims, 13 Drawing Sheets

SPUTTERING APPARATUS

BACKGROUND OF THE INVENTION

1. Field of the Invention

The present invention relates to a sputtering apparatus used for manufacturing optical discs, comprising a reflective film made of a metal material such as aluminum deposited upon a disc substrate and, in particular, to a sputtering apparatus which is capable of successively carrying out sputtering-treatment of a disc substrate.

2. Description of the Prior Art

Optical discs which are formed for enabling given information signals such as audio or video signals to be recorded or reproduced have been proposed. The optical disc comprises a disc substrate of a material such as polycarbonate or acrylic resin, having bits or grooves formed thereon, and which is coated with a reflective film made of metal material such as aluminum.

Methods of coating a disc substrate with a metal material include vacuum deposition, ion plating and sputtering methods.

The vacuum deposition and ion plating methods include the steps of heating a metal material (evaporation source) to evaporate the metal material in a vacuum chamber and exposing a disc substrate to the vapor of the metal material for depositing the metal material on the substrate. Mass production of optical discs by these methods relies upon a so-called batch manufacturing system in which a multiplicity of optical discs are manufactured by one time evaporation of the metal material by using a large vacuum chamber which is capable of collectively containing a plurality of optical discs. Therefore, the manufacturing system does not only become more complicated in structure and larger in size, but also the resultant products become non-uniform in quality when located in different positions in the vacuum chamber.

In contrast to this, the sputtering method has advantages that treatment is completed in a short period of time, that successive treatments are possible and that coating of individual disc substrates can be performed under the same conditions. Accordingly, adoption of this sputtering method can not only provide the substrates with uniform coating, but the method can also cope well with mass production and multi-kind production.

The sputtering treatment comprises flowing a discharge gas, such as argon, at a low pressure into a vacuum chamber in which disc substrates and a metal material (target), such as aluminum, are disposed. An electric field is established in the vacuum chamber to ionize the discharge gas and ejecting atoms and molecules out of the metal material with the ionized discharge gas. That is, in the vacuum chamber, the discharging gas is ionized and collides with the metal material. The metal material is thus sputtered so that the sputtered metal material is deposited upon the disc substrates to form thin films thereon.

A sputtering apparatus for performing this sputtering treatment has been proposed which is designed to successively perform the sputtering treatments on a plurality of disc substrates by rotating a disc-like carrying table on which the plurality of disc substrates are placed in a circumferential direction as shown in, for example, FIG. 1.

The sputtering apparatus is designed so that the inner pressure is kept at a given vacuum degree and has a vacuum chamber 103 which is formed with a disc entrance and exit opening 101 through which disc substrate 100 is loaded and unloaded and a sputtering treatment portion 102 for performing sputtering treatments. The disc entrance and exit opening 101 is provided with a lid 104 for keeping an inner pressure in the vacuum chamber 103, which is supported and is moved toward and away from the vacuum chamber 103.

On the other hand, the sputtering treatment portion 102 has a disc treatment opening 105 which is formed similarly to the disc entrance and exit opening 101 and a cylindrical treatment portion 106 mounted on the Vacuum chamber 103 so that the portion 106 covers the upper side of the disc treatment opening 105. A metal material (target) 107 which is sputtered on the substrate 100 is disposed in the treatment portion 106, and argon gas and the like are charged therein at a low pressure.

A disc-like carrying table 108 which successively carries a plurality of the disc substrates 100 between the disc entrance and exit opening 101 and the sputtering treatment portion 102 is disposed in the vacuum chamber 103. The carrying table 108 is supported on a rotary shaft 108a projecting in the vacuum chamber 103 and is driven by drive means (not shown) to rotate around the axis thereof. The carrying table 108 is formed with a circular positioning recess 108b on which the disc substrate 100 rests. A tray 109 which positions the disc substrate 100 by aligning a centering hole 100a of the disc substrate 100 with the recess 108b is adapted into the recess 108b. The tray 109 is formed into a disc having a diameter slightly larger than the outer diameter of the disc substrate 100 and is provided at the substantial center thereof with a projection 109a which passes through the chucking centering hole of the disc substrate 100. A through-hole 108c through which push up rods 110 and 111 for pushing up the tray 109 pass is formed in the substantial center of the positioning recess 108b of the carrying table 108.

The push up rods 110 and 111 pass through through-holes which are opposite to the disc entrance and exit opening 101 and the sputtering treatment portion 102, respectively and extend to the inside of the vacuum chamber 103, and are designed to be moved in a vertical direction by a drive apparatus (not shown). When the disc substrate 100 is carried to positions opposite to the disc entrance and exit opening 101 and the sputtering treatment portion 102, the respective push up rods 110 and 111 are moved upward for urging the trays 109 and 109a upon the peripheries of the disc entrance and exit opening 101 and the disc treatment opening 105, respectively so that the vacuum chamber 103 is sealed from the outside (atmosphere). When unloading of the disc substrate 100 from the opening 101 and sputtering treatment in the sputtering treatment portion 102 is completed, the respective push up rods 110 and 111 are moved toward the bottom of the vacuum chamber 103.

In the thus formed sputtering apparatus, the plurality of disc substrates 100 supplied from the disc entrance and exit opening 101 are successively carried to the sputtering treatment portion 102 at which they are successively subjected to sputtering treatment and simultaneously with this, unloading of the sputter-treated disc substrates 100 and loading of the untreated disc substrates 100 onto the carrying table 108 is carried out.

Removal of a sputter-treated disc substrate and supply of the untreated new disc substrate D to the carrying table 108 is achieved while the tray 109 is brought into a pressure-contact with the peripheral edge of the disc entrance and exit opening 101 by the push up rod 110. The vacuum chamber 103 is sealed by a seal member, such as an O-ring, provided along the peripheral edge of the tray 109 so that the atmosphere is prevented from being introduced into the vacuum chamber 103. After completion of these operations, the disc entrance and exit 101 is closed by the lid 104 and simultaneously with this, the vacuum chamber 103 is evacuated to a given vacuum pressure suitable for sputtering by operating a vacuum pump.

Since the carrying table 108 is disc-like in shape and the distance between the upper side of the carrying table 108 and the vacuum chamber 103 is very short, evacuation particularly above the disc substrate cannot be sufficiently achieved since the vacuum degree in the vacuum chamber 103 cannot be made uniform. If the vacuum degree is insufficient in such a manner, residual impurities, such as water or gas, remaining in or on the disc substrate D are scattered and deposited on a sputtering electrode and the like, such that an excellent film may not be formed.

Due to the fact that the tray has a very heavy weight and that the pressure in the sputtering treatment portion 102 is as high as about 130 kg/m$^2$, deterioration of the O-ring (not shown) for sealing the space between the push up rod 111 for supporting the tray 109 and the vacuum chamber 103 is considerable.

OBJECTS AND SUMMARY OF THE INVENTION

It is an object of the present invention to provide a sputtering apparatus which is capable of achieving a high quality, sputtering treatment on a disc substrate.

It is another object of the present invention to provide a sputtering apparatus which is capable of positively sealing the inside of a vacuum chamber from the atmosphere and rapidly providing the inside of the vacuum chamber with a given vacuum degree by a compact vacuum pump.

It is a further object of the present invention to provide a sputtering apparatus which is capable of providing a uniform vacuum degree in a vacuum chamber.

It is a further object of the present invention to provide a sputtering apparatus which is capable of achieving rapid loading and unloading of members to be sputter-treated into and from a vacuum chamber.

In order to accomplish the above objects, the sputtering apparatus of the present invention comprises a vacuum chamber having a supply opening through which a member to be sputter-treated is loaded into and unloaded from the chamber and a sputter-treatment portion; a lid for closing said supply opening; a tray having an opening formed in a substantial center thereof on which the member to be sputter-treated is placed; a push up rod vertically movable toward and away from the supply opening, having a closing side for closing the opening of the tray from the lower side of the tray; and carrying means for carrying said member between said supply opening and said sputter-treatment portion while the member to be treated is placed upon the tray, whereby the supply opening of the vacuum chamber is closed by the lid during the sputtering treatment, and the supply opening of the vacuum chamber is closed by the tray and the closing side of the push up rod which closes the opening of the tray on the lower side thereof.

The supply opening of the vacuum chamber is doubly closed by the tray and a closing side of the push up rod which closes upwardly the opening of the tray during loading and unloading of members to be treated since the sputtering apparatus of the present invention has an opening in the substantial center of the tray on which the member to be treated is placed and is provided with the push up rod having a closing side for closing the opening in an upward direction. Therefore, sealing between the inside of the vacuum chamber and the atmosphere is so positive that the introduction of the atmosphere into the vacuum chamber is prevented.

When loading and unloading of the member to be treated is completed, the supply opening of the vacuum chamber is closed by the lid and simultaneously with this, the push up rod is lowered so that the tray is placed on the carrying means, and evacuation is performed by the vacuum pump. Since an opening is formed in the substantial center of the tray, evacuation above the disc substrate is performed through this opening, and water and gas and the like contained in the disc substrate are evacuated together with air. Therefore, the vacuum degree in the vacuum degree becomes uniform, and deposition onto the sputtering electrode due to scattering of the gas and the water is avoided so that an excellent sputtering treatment can be performed.

BRIEF DESCRIPTION OF THE DRAWINGS

Other objects and advantages of the present invention will become more clear by reading the detailed description of the embodiments with reference to the drawings in which:

FIG. 17 shows the condition when a disc entrance and exit opening is closed by a tray;

FIG. 18 shows the condition when a disc substrate is loaded;

FIG. 19 shows the condition when loading of the disc substrate is completed;

FIG. 20 shows the condition when carrying of a disc substrate to a sputtering treatment portion is completed;

FIG. 21 shows the condition when the disc substrate is subjected to a sputtering treatment;

FIG. 22 shows the condition when the sputtering treatment is completed;

FIG. 23 shows the condition when carrying of the disc substrate to the disc entrance and exit opening is completed;

FIG. 24 shows the condition when the disc substrate is unloaded; and

FIG. 25 shows the condition when closing sides of the lid are changed.

DESCRIPTION OF THE PREFERRED EMBODIMENTS

An embodiment in which the present invention is applied will now be described with reference to the drawings. In the present embodiment, the sputtering apparatus of the present invention is used for manufacturing optical discs in which disc substrates made of a synthetic resin, such as polycarbonate and acrylic resins, are formed with a thin film made of a metal material, such as aluminum, by sputtering.

Figure 1:
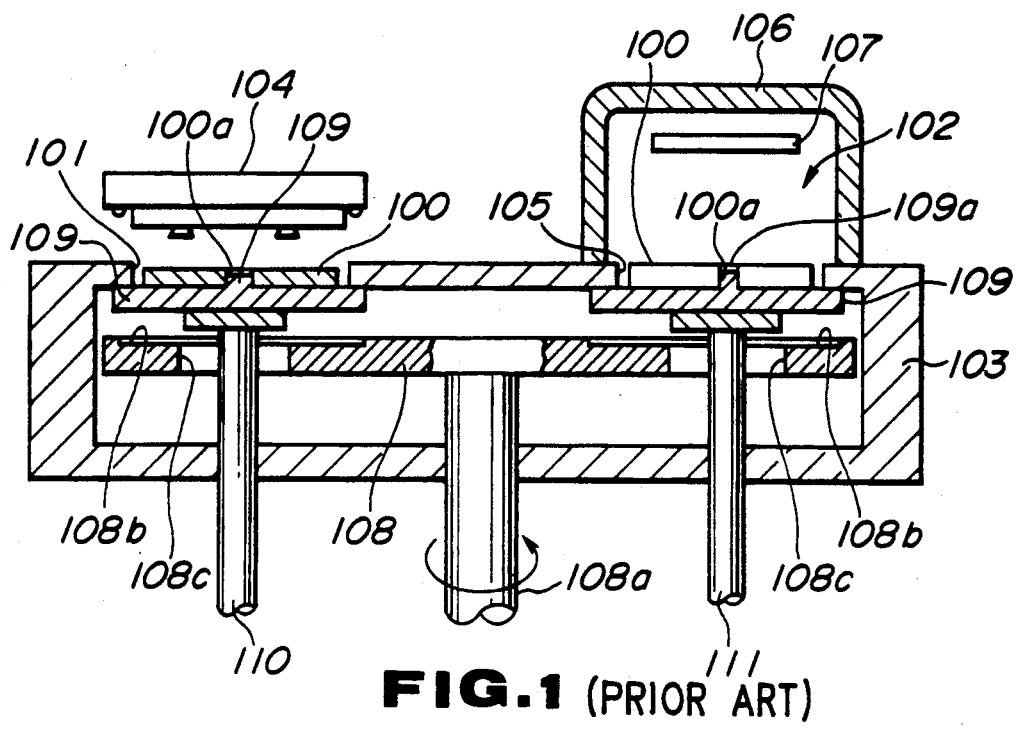
FIG. 1 is a longitudinal sectional view showing an example of a prior art sputtering apparatus.
Figure 2:
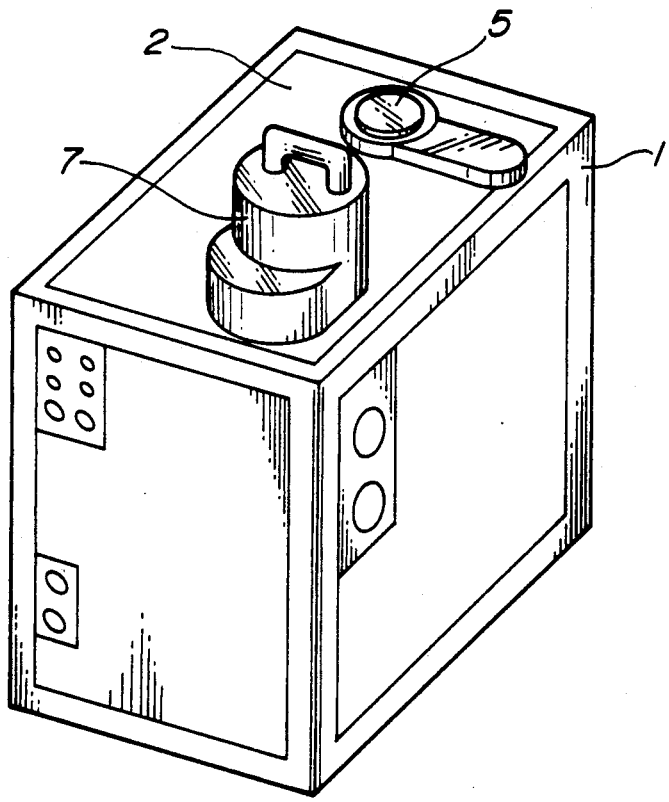
FIG. 2 is a perspective view showing an embodiment of an optical disc manufacturing apparatus.

The optical disc manufacturing apparatus of the present embodiment comprises a vacuum chamber 2 housed in a rectangular housing 1 (not shown), and an evacuating system including a vacuum pump and the like is disposed below the vacuum chamber 2 as shown in FIG. 2.

Figures 3, 4:
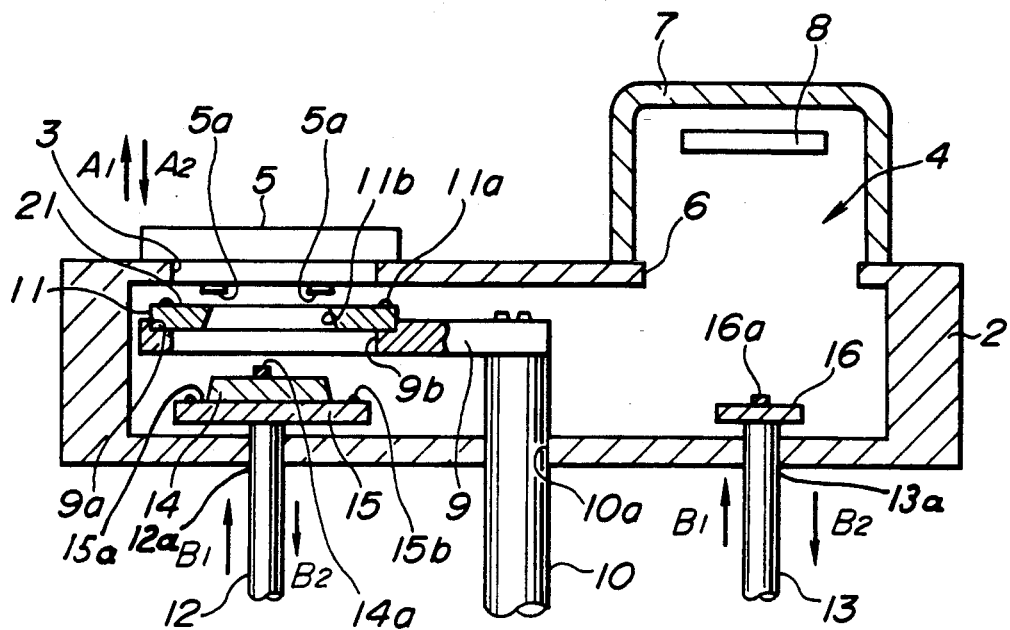
FIG. 3 is a longitudinal sectional view of a vacuum chamber of the apparatus.
FIG. 4 is a cross-sectional view of the vacuum chamber.
Figure 5:
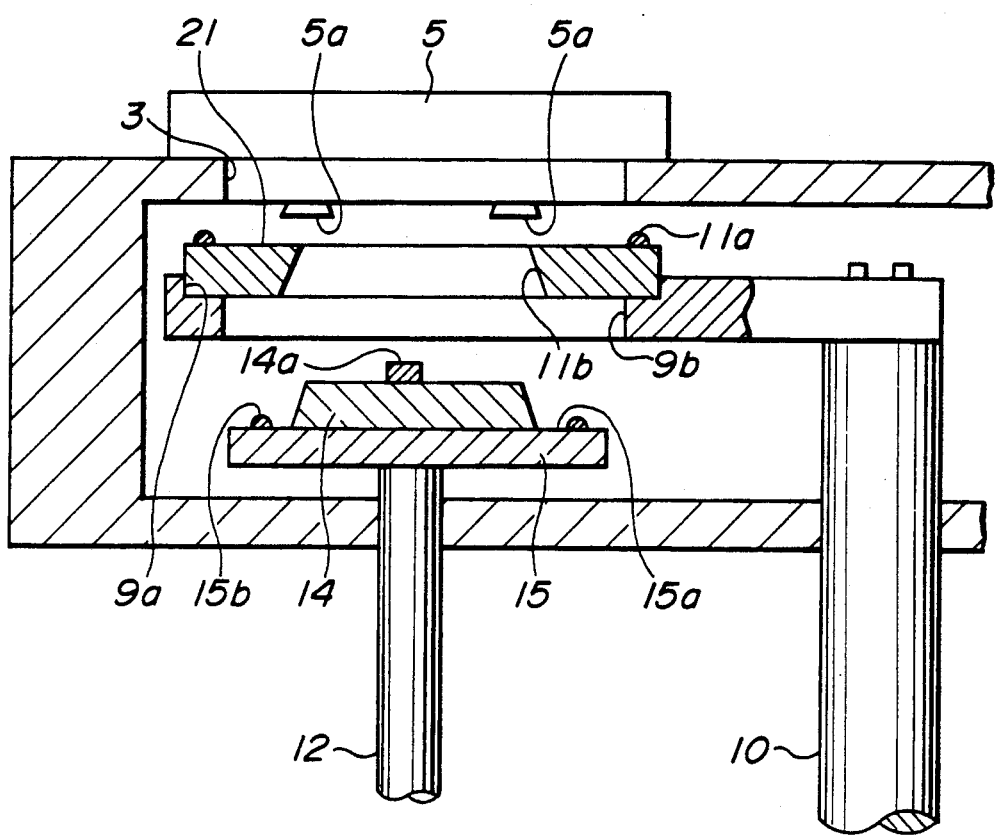
FIG. 5 is an enlarged longitudinal sectional view showing main components of the vacuum chamber on the side of the disc entrance and exit opening.

The vacuum chamber is formed as shown in FIGS. 3 and 4 so that it is evacuated by the vacuum pump and so that the inner pressure is maintained at a given vacuum pressure. A disc entrance and exit opening 3 through which untreated and treated disc substrates are loaded and unloaded is juxtaposed with a sputtering treatment portion 4 in which sputtering treatments are performed to the disc substrates on the upper side of the vacuum chamber 2.

The disc entrance and exit opening 3 is formed as a supply opening through which untreated and treated disc substrates are loaded and unloaded into and from the vacuum chamber 2, respectively, and is formed in a substantially circular shape having a diameter larger than the outer dimension of the disc substrates, depending upon the shape of the disc substrates. A lid 5 which is capable of opening and closing the disc entrance and exit opening 3 is provided thereabove. The lid 5 is supported by a support mechanism (not shown) so that it is moved toward and away from the vacuum chamber 2 in the direction of arrows $A_1$ and $A_2$ in FIG. 3. The lid 5 is moved toward the vacuum chamber 2 to pressure-contact with the peripheral edge of the disc entrance and exit opening 3 for closing the disc entrance and exit opening 3 and is moved away from the vacuum chamber 2 for opening the disc entrance and exit opening 3. The lid 5 has sucking pads 5a on the side facing the disc entrance and exit opening 3. The disc substrate is sucked by the sucking pads 5a so that loading and unloading of the disc substrate to and from the disc entrance and exit opening is carried out.

A seal member, such as an O-ring 5b (FIG. 6), is provided along the peripheral edge on the lower side thereof so that an air tightness inside the vacuum chamber 2 is kept when the peripheral edge of the lid 5 is brought into pressure-contact with the peripheral edge of the disc entrance and exit opening 3.

The sputtering treatment portion 4 comprises a disc treatment opening 6 which is formed similarly to the disc entrance and exit opening 3 and a treatment portion 7 for keeping the inner pressure in the vacuum chamber 2 at an evacuated pressure and which is mounted on the vacuum chamber 2 to cover the upper side of the disc treatment opening 6. The treatment portion 7 comprises a cylindrical enclosure having a closed upper end and is provided with a metal material (target) 8 used for sputtering and a low pressure discharging gas, such as argon, which is necessary for sputtering treatment. An electrostatic field is established in the treatment portion 7.

A swing arm 9 forming a carrying means for shifting the disc substrate between the disc entrance and exit opening 3 and the sputtering treatment portion 4 is provided in the vacuum chamber 2. The swing arm 9 is disc-shaped only at the free end on which the disc substrate rests and is tapered at the base end. The swing arm 9 is bolted at the base end thereof to the tip end of the rotary shaft 10 which projects upward in the vacuum chamber 2 and is swung around the axis thereof in directions represented by arrows $L_1$ and $L_2$ in FIG. 4 by a drive device (not shown). For example, the swing arm 9 is swung over an angle of about 90° represented by $\theta$ in FIG. 4 for achieving carrying of the disc substrates between a position below the disc entrance and exit opening 3 and a position below the sputtering treatment portion 4. O-rings for maintaining an airtightness in the vacuum chamber 2 are provided in a through-hole (not shown) bored in the bottom of the vacuum chamber through which the rotary shaft 10 extends to the inside of the vacuum chamber 2.

A circular positioning recess 9a on which a disc substrate rests is formed on the upper side of the swing arm 9 at the free end thereof. A through-hole 9b is bored in the center of the recess 9a. Push up rods 12 and 13 which will be described hereafter extend through the hole 9b. A tray 11 on which a disc substrate rests is adapted to fit into and is placed upon the recess 9a. The tray 11 is formed into a disc having a diameter slightly larger than the outer dimension of the disc substrate and has a disc resting face 21 on an upper side thereof opposite to the disc entrance and exit opening 3 on which the disc substrate is placed. A ring-like seal member 11a, such as an O-ring, is mounted along the outer peripheral edge of the tray 11 so that it surrounds the disc resting face 21. The seal member is adapted to maintain airtightness in the vacuum chamber 2 when the peripheral edge of the tray 11 is in pressure-contact with the peripheral edge of the disc entrance and exit opening 3 on the lower side of the tray 11. The tray 11 has formed in the substantial center thereof a circular opening 11b to which push up rods 12 and 13 described hereafter extend. Accordingly, the weight of the tray 11 can be reduced so that the force of the push up rod 12 for urging the tray upward may be made smaller, and the durability of the O-ring provided in the through-hole 12a bored at the bottom of the vacuum chamber 2 through which the push up rod 12 extends to the inside of the vacuum chamber 2 can be enhanced.

The opening 11b has such a dimension that the disc substrate placed upon the disc resting face 21 will not fall therethrough and is formed in such a manner that the inner diameter gradually increases from the upper to lower side thereof. That is, the inner peripheral surface of the opening 11b is tapered so that the opening diameter is gradually increased toward the bottom of the vacuum chamber 2 from the disc resting face 21.

At the bottom of the vacuum chamber 2, there are provided push up rods 12 and 13 which are vertically moved in a direction of arrows $B_1$ and $B_2$ in FIG. 3 toward and away from the disc entrance and exit 3 and the disc treatment opening 6, respectively, by a drive device including control means (not shown).

Among the push up rods 12 and 13, the push up rod 12 facing toward the disc entrance and exit opening 3 is provided at the top end thereof with a circular positioning portion 14 which is extended to fill the opening 11b formed in the tray 11 for positioning the tray 11. A circular tray push up portion 15 is provided under the portion 14 having a closing side 15a which closes the opening 11b of the tray 11 at the lower side thereof.

The positioning portion 14 has a tapered outer peripheral surface having a diameter gradually reducing from the base end to the upper side thereof and is formed in the shape of a cone corresponding to the shape of the opening 11b of the tray 11. Since the positioning portion 14 is provided with a tapered outer peripheral surface having a reduced diameter at the top end thereof which is on the insertion side relative to the tapered opening 11b, an insertion operation into the opening 11b is positive and easy.

The positioning portion 14 is provided in the substantial center of the upper side thereof with a circular projection 14a which is inserted into the centering hole of the disc substrate resting upon the tray 11 for positioning the disc substrate. The tray push up portion 15 is formed into a disc having a diameter smaller than the inner diameter of the through-hole 9b of the swing arm 9 and larger than the inner diameter of the opening 11b of the tray 11 and is formed with the positioning portion 14 in the substantial center thereof. The annular side 15a between the outer peripheral edge of the tray push up portion 15 and the positioning portion 14 defines a closing side for closing the opening 11b of the tray 11 when the push up rod 12 is extended upward to abut the bottom of the tray 11. A seal member 15b, such as an O-ring and the like, is mounted on the upper side of the tray push up portion 15 along the peripheral edge thereof for keeping an airtightness in the vacuum chamber 2 when the peripheral edge of the tray push up portion 15 is brought into pressure contact with the peripheral edge of the opening 11b of the tray 11.

At the top end of the other push up rod 13 facing the disc treatment opening 6, there is formed a disc-like substrate push up portion 16 for pushing up a disc substrate resting upon the tray 11 toward the disc treatment opening 6. The substrate push up portion 16 is formed into a disc having a diameter smaller than the inner diameter of the opening 11b of the tray 11 and larger than the inner diameter of the centering hole of the disc substrate and has an upper side upon which the disc substrate rests. Accordingly, if the push up rod 13 extends toward the disc treatment opening 6, only the disc substrate which has rested upon the tray 11 is pushed up while it rests upon the substrate push up portion 16. A cylindrical projection 16a which is inserted into the centering hole of the disc substrate for performing the positioning thereof is provided in the substantial center of the substrate push up portion 16 so that the positioning of the disc substrate relative to the substrate push up portion 16 is performed.

Seal members, such as O-rings and the like (not shown), for keeping airtightness in the vacuum chamber 2 are provided in through-holes 12a, 13a bored in the bottom of the vacuum chamber 2 through which the push up rods 12 and 13 extend into the vacuum chamber 2.

Figure 6:
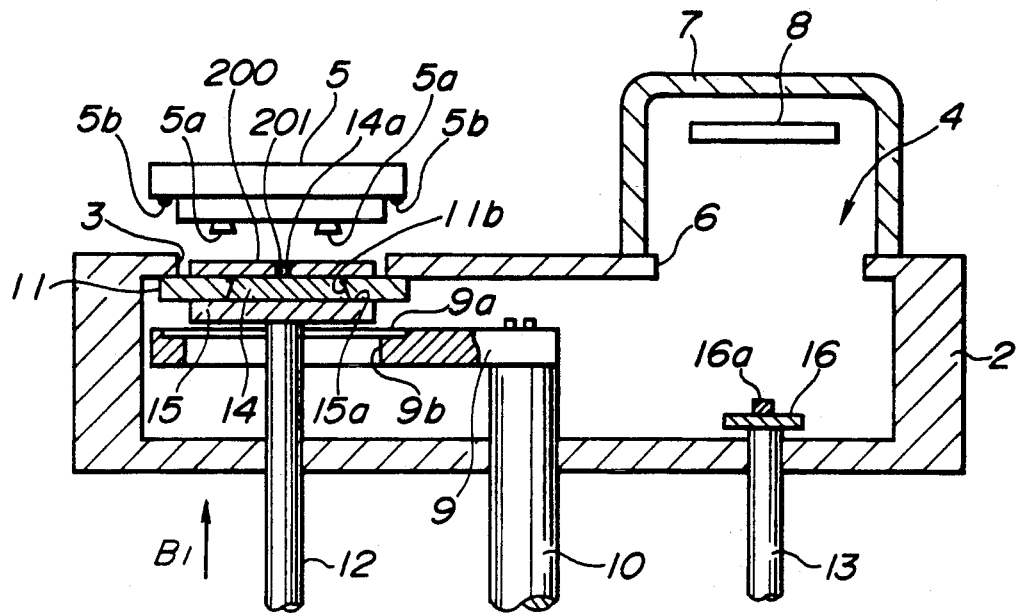
FIG. 6 is a longitudinal sectional view of the vacuum chamber showing the condition when a disc substrate is loaded.

The thus formed push up rods 12 and 13 are operated to extend upward when the top end of the swing arm 9 is positioned to face the disc entrance and exit opening 3 and the disc treatment opening 6, respectively. That is, as shown in FIG. 6, the positioning portion 14 of the push up rod 12 is extended upward into the opening 11b of the tray 11 resting upon the swing arm 9 through the push up rod through-hole 9a formed in the swing arm 9 so that the positioning of the tray 11 is carried out and the opening 11b of the tray 11 is closed by the closing side 15a provided on the tray push up portion 15 of the push up rod 12. When the push up rod 12 is further extended, the upper side of the peripheral edge of the tray 11 is brought into pressure-contact with and is supported by the peripheral edge of the disc entrance and exit opening 3. since the seal members 11a and 15b, such as O-rings, are provided along the peripheral edges of the tray 11 and the tray push up portion 15, respectively, the disc entrance and exit opening 3 is doubly closed by the tray 11 and the closing side 15b of the tray push up portion 15 which closes the opening 11b of the tray at the lower side thereof, resulting in a positive sealing between the vacuum chamber 2 and the outside thereof.

Figure 9:
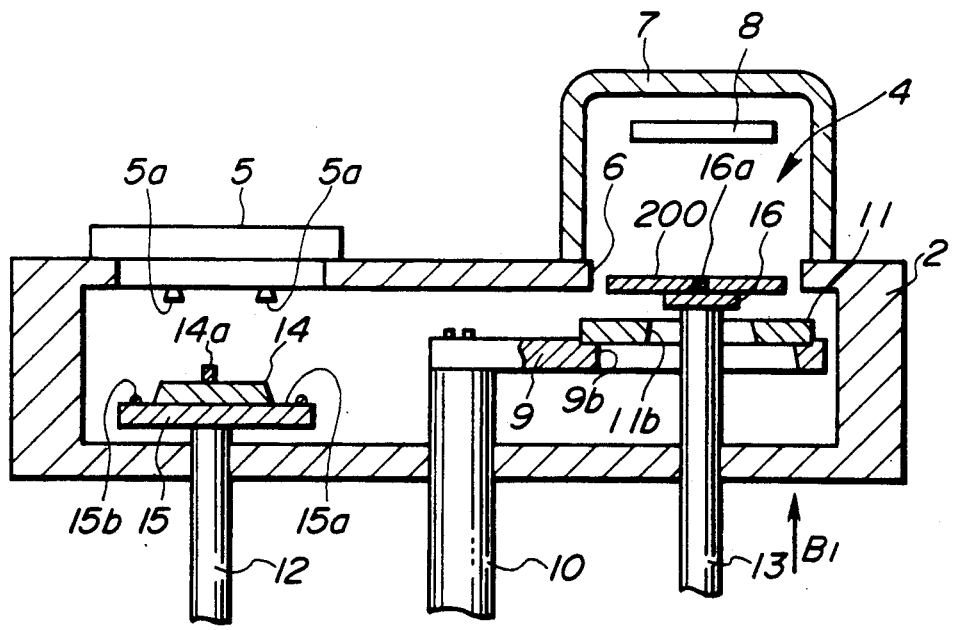
FIG. 9 is a longitudinal sectional view of the vacuum chamber showing the condition when the disc substrate is subjected to a sputtering treatment.

On the other hand, the projection 16a provided at the top end of the push up rod 13 is extended through the push up rod through-hole 9b of the swing arm 9 and the opening 11b of the tray 11 to adapt to the centering hole of the disc substrate resting upon the tray 11 so that the disc substrate is positioned on the substrate push up portion 16 as shown in FIG. 9. When the push up rod 13 is further extended, the disc substrate is lifted up to the vicinity of the disc treatment opening 6. Since only the disc substrate is located in the disc treatment opening 6, a spacing is formed between the disc substrate and the disc treatment opening 6.

In the thus formed optical disc manufacturing apparatus, a conveying operation of the disc substrate between the disc entrance and exit opening 3 and the sputtering treatment portion 4 is performed by one swing arm 9 at a small swing angle. The vacuum chamber may be made compact in size, and the vacuum chamber 2 may be made larger in volume. Therefore, a vacuum pump for evacuating the chamber may be made compact, and the period of time required for the evacuation may be shortened.

The optical disc is manufactured by the present optical disc manufacturing apparatus as follows:

The tray 11 resting upon the swing arm 9 is first raised upwardly by pushing the push up rod 12 facing the disc entrance and exit opening 3 in the direction of arrow $B_1$ in the drawing and toward the disc entrance and exit opening 2 as shown in FIG. 6 so that the peripheral edge of the tray 11 is brought into pressure-contact with the peripheral edge of the disc entrance and exit opening 3.

At this time, the disc entrance and exit opening 3 is doubly closed by the tray 11 and the closing side 15a of the tray push up portion 15 provided on the top end of the push up rod 12 which closes the opening 11b of the tray 11 on the lower side thereof. Since the seal members 11a and 15b are provided on the tray 11 and the tray push up portion 15, respectively, sealing between the inside of the vacuum chamber 2 and the atmosphere becomes positive so that the atmosphere is prevented from entering into the vacuum chamber 2. Since the tray 11 is provided with the opening 11b, the weight of the tray 11 is light so that a high loading will not be imposed upon the push up rod 12. Accordingly, the durability of the O-ring provided in the through-hole through which the push up rod 12 is extended into the vacuum chamber 2 is enhanced.

Subsequently, the lid 5 is separated from the vacuum chamber 2 in this condition so that the upper side of the tray 11 is exposed upward through the disc entrance and exit opening 3. A disc substrate 200 to be treated is placed upon the tray 11.

Figure 7:
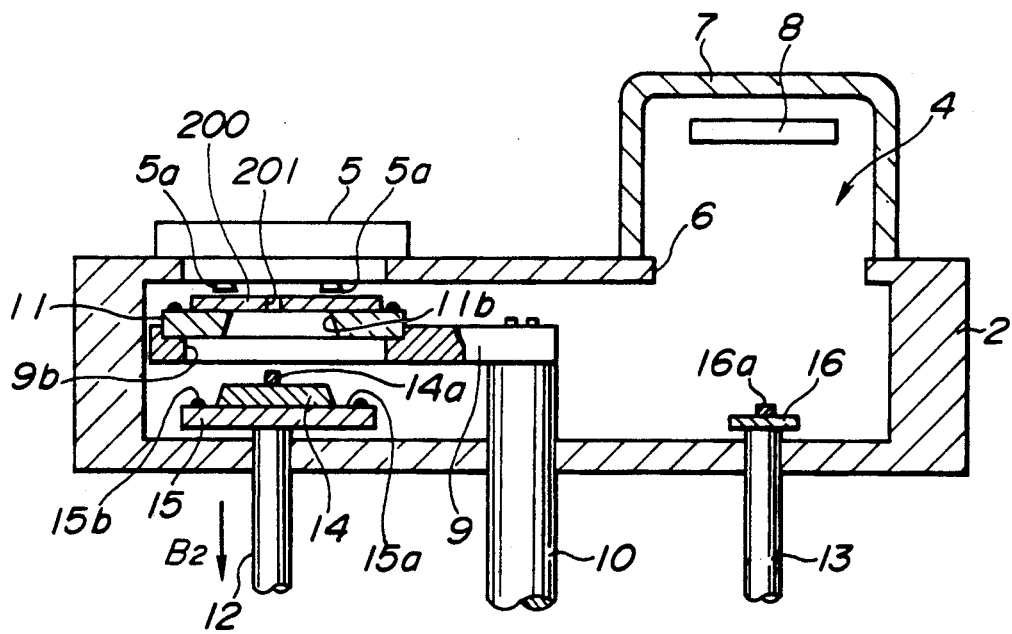
FIG. 7 is a longitudinal sectional view of the vacuum chamber showing the condition when loading of the disc substrate is completed.

Since the projection 14a provided on the tip end of the push up shaft 12 projects upward from the upper side of the tray 11 at this time, the projection 14a extends through the centering hole of the disc substrate. Accordingly, the disc substrate 200 rests upon the tray 11 when it is positioned upon the tray 11. The vacuum degree which has been lost by the opening and closing operation of the disc entrance and exit opening 3 is recovered by operating the vacuum pump while the disc entrance and exit opening 3 is closed by the lid 5 by moving the lid 5 downward as shown in FIG. 7. Then the tray 11 is placed upon the recess 9a of the swing arm 9 by retracting the push up rod 12 in the direction of arrow $B_2$ to move the tray 11 downward.

Since the tray 11 is formed with the opening 11b in the center thereof, evacuation above the disc substrate 200 is carried out via the centering hole 201 of the disc substrate 200. Accordingly, the vacuum degree above the disc substrate 200 becomes uniform, and water and gas contained in the disc substrate 200 are evacuated together with air. Since only one swing arm 9 is provided in the present embodiment of the vacuum chamber 2, there is no obstacle for evacuation. Accordingly, a given vacuum degree can be rapidly reached, for example, in no longer than one second.

Figure 8:
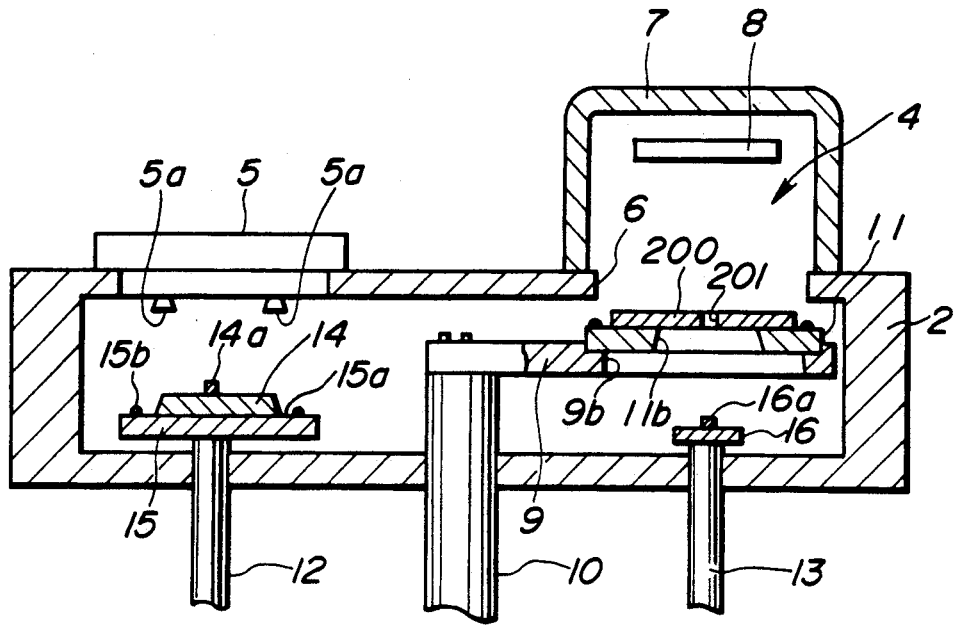
FIG. 8 is a longitudinal sectional view of the vacuum chamber showing the condition when carrying of the disc substrate to a sputtering treatment portion is completed.

After the tray 11 has been placed upon the top end of the swing arm 9, the swing arm 9 is swung to the sputtering treatment portion 4 in the direction of arrow $L_1$ in the drawing so that the disc substrate 200 resting upon the tray 11 is positioned below disc treatment opening 6 as shown in FIG. 8.

If the positioning of the tray 11 is completed, the push up rod 13 located below the tray 11 is extended upward in the direction of arrow $B_1$ in FIG. 9 to move the disc substrate 200 to the vicinity of the disc treatment opening 6 as shown in FIG. 9.

Since the push up rod 13 has a substrate push up portion 16 which is a disc having a diameter smaller than the inner diameter of the opening 11b of the tray and larger than the inner diameter of the centering hole 201 of the disc substrate 200, the rod 13 will lift only the disc substrate 200 upward through the push up rod through-hole 9b and the opening 11b of the tray 11. Accordingly, the force for lifting the push up rod 13 upward may be made smaller, and the durability of the O-ring provided in the through-hole 13a through which the push up rod 13 is inserted into the centering hole 201 of the disc substrate 200, the disc substrate 200 is held while it is positioned by the push up rod 13.

When the position of the disc substrate 200 relative to the disc treatment opening 6 has been determined, the sputtering treatment of the disc substrate 200 is commenced.

Since a clearance is formed between the disc substrate and the disc treatment opening 6, water and gas and the like contained in the disc substrate 200 migrates to the bottom of the vacuum chamber 2 through this clearance. Therefore, deposition of these gases upon the sputtering electrode due to scattering is avoided so that an excellent sputtering treatment may be achieved.

Figure 10:
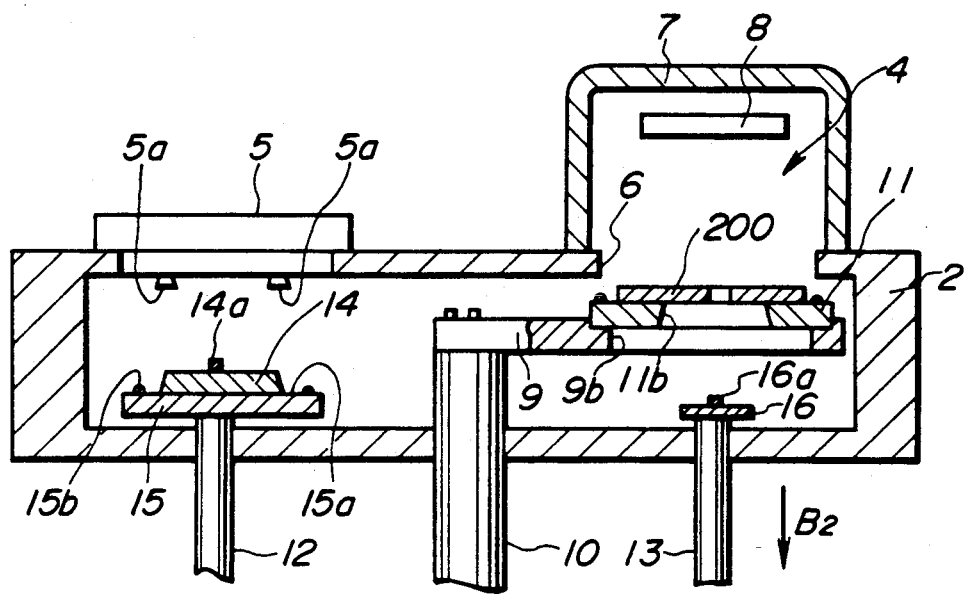
FIG. 10 is a longitudinal sectional view of the vacuum chamber showing the condition when the sputtering treatment is completed.

After the sputtering treatment has been completed, the push up rod 13 is lowered into the side at which the vacuum pump and the like is provided in the direction of arrow $B_2$ as shown in FIG. 10 so that the disc substrate 200 is placed upon the tray 11.

If the disc substrate 200 is placed upon the tray 11, the swing arm 9 is swung to the disc entrance and exit opening 3 in the direction of arrow $B_2$ in FIG. 3.

Figure 11:
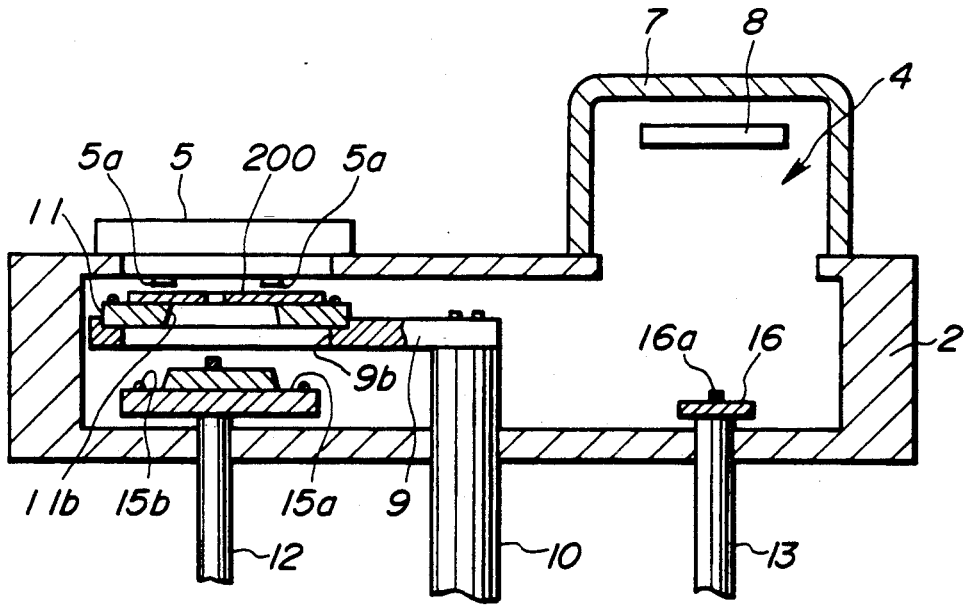
FIG. 11 is a longitudinal sectional view of the vacuum chamber showing the condition when carrying of the disc substrate to the disc entrance and exit opening is completed.

The tray 11 on which the disc substrate 200 with a thin film of aluminum formed thereon is then positioned below the disc entrance and exit opening 3 as shown in FIG. 11.

Figure 12:
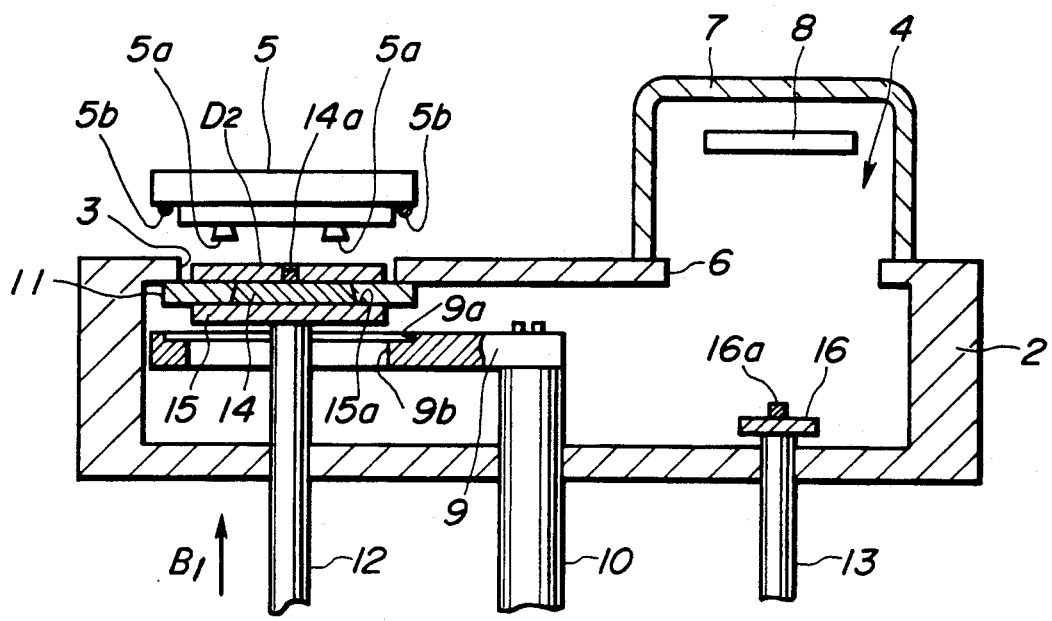
FIG. 12 is a longitudinal sectional view of the vacuum chamber showing the condition when the disc substrate is unloaded.

When the tray 11 is positioned below the disc entrance and exit opening 3, the push up rod 12 is extended in the direction of arrow $B_1$ to move the tray 11 upward as shown in FIG. 12 so that the disc entrance and exit opening 3 is doubly closed by the tray 11 and the closing side 15a provided on the push up rod 12 which closes the opening 11b of the tray 11 on the lower side thereof.

The lid 5 is then separated from the vacuum chamber 2 so that the disc substrate 200 resting on the tray 11 is removed from the vacuum chamber 2 through the disc entrance and exit opening 3, and a new disc substrate 200 is positioned and placed upon the upper side of the tray 11.

Thereafter, disc substrates are successively sputter-treated by sequentially repeating the above mentioned steps.

If optical discs are manufactured in such a manner by using the optical disc manufacturing apparatus of the present invention, excellent sputtering treatment can be achieved to provide good quality metal films containing no gases since water and gas and the like contained in the disc substrates will not be scattered upon the sputtering electrode and the like.

Although positioning of a disc substrate resting on the disc resting face 21 of the tray 11 is performed by bringing the projection 14a projecting from the center of the positioning portion 14 provided on one of the push up rods 12 into engagement with the centering hole of the disc substrate in the abovementioned embodiment, positioning of the disc substrate may be performed so that the outer periphery of the disc substrate resting upon the tray 11 is held.

Figure 13:
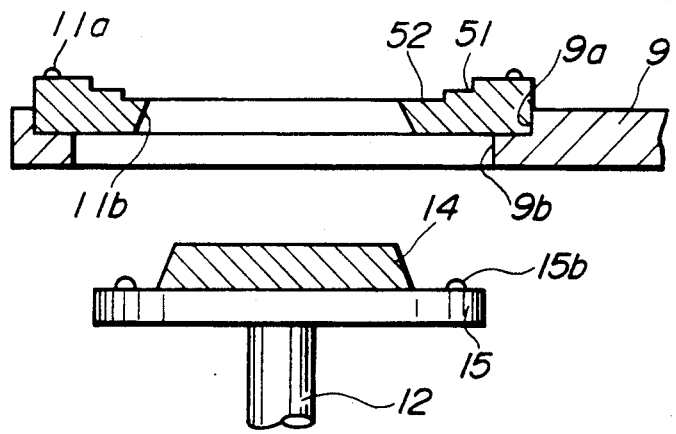
FIG. 13 is a longitudinal sectional view showing another example of a tray forming an optical disc manufacturing apparatus of the present invention.

That is, disc adapting recesses 51 and 52 having dimensions corresponding to the outer diameters of the disc substrates may be formed on the upper side of the tray 11 on which the disc substrate is placed, as shown in FIG. 13. In this case, large and small disc adapting recesses 51 and 52 corresponding to different sizes of the disc substrates are formed at different depths so that disc substrates having different diameters are positioned therein, respectively. Forming the disc adapting recesses 51 and 52 in such a manner makes it possible to support the disc substrate resting on the tray 11 at the outer periphery thereof so that it is positioned on the disc adapting recesses 51 and 52.

The disc adapting recesses 51 and 52 may be formed stepwise depending upon the various disc substrates resting upon the tray 11.

Providing the disc adapting recesses 51 and 52 in such a manner eliminates the projection on the push up rod 12 which is engaged with the centering hole of the disc substrate which was necessary to achieve positioning of the disc substrate.

Figure 14:
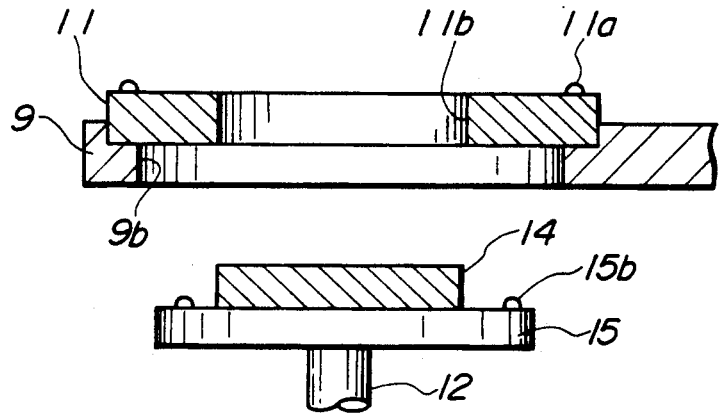
FIG. 14 is a longitudinal sectional view showing a further example of a tray forming an optical disc manufacturing apparatus of the present invention.

Although the opening 11b of tray 11 which is engaged with the positioning portions 14 provided on the push up rod 12 is tapered so that the opening diameter is gradually increased from the disc resting face 21 to the lower side thereof, the opening 11b may be formed into a cylindrical shape having a constant diameter from the disc resting face 21 to the lower side thereof. In this case, the positioning portion 14 which is engaged with the opening 11b is also formed into a cylindrical shape on the outer periphery thereof corresponding to the opening 11b (see FIG. 14).

Now a detailed embodiment of a sputtering apparatus of the present invention, including a mechanism for loading and unloading of a member to be sputter-treated using a lid which closes a supply opening provided on a vacuum chamber through which the member to be sputter-treated is loaded and unloaded, will be described with reference to FIGS. 15-25.

Figure 15:
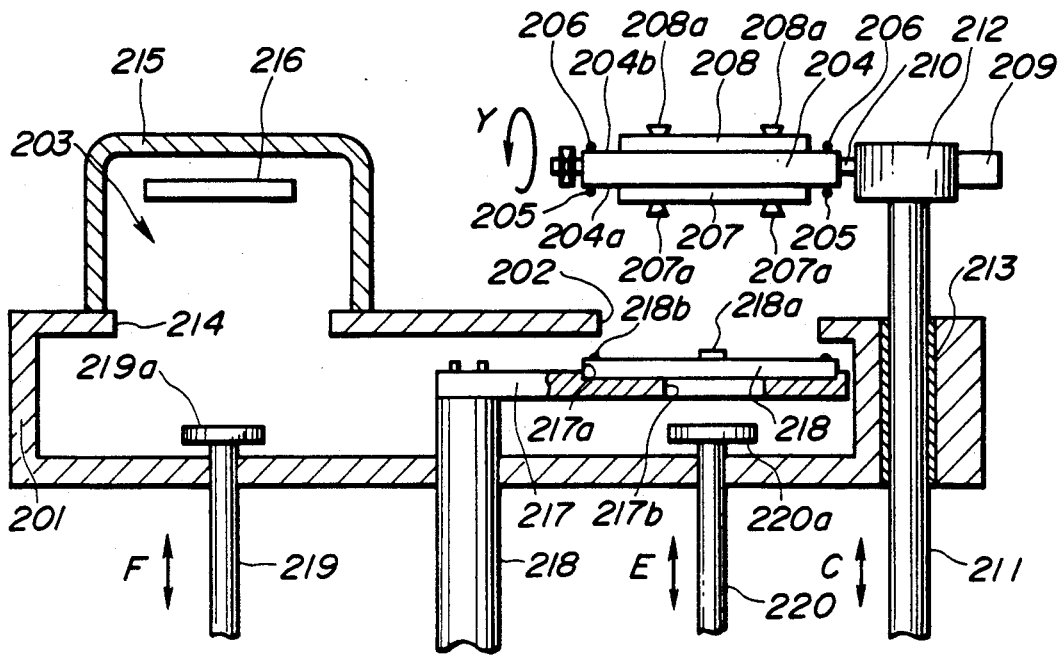
FIG. 15 is a longitudinal sectional view showing the vacuum chamber of another embodiment of an optical disc manufacturing apparatus.
Figure 16:
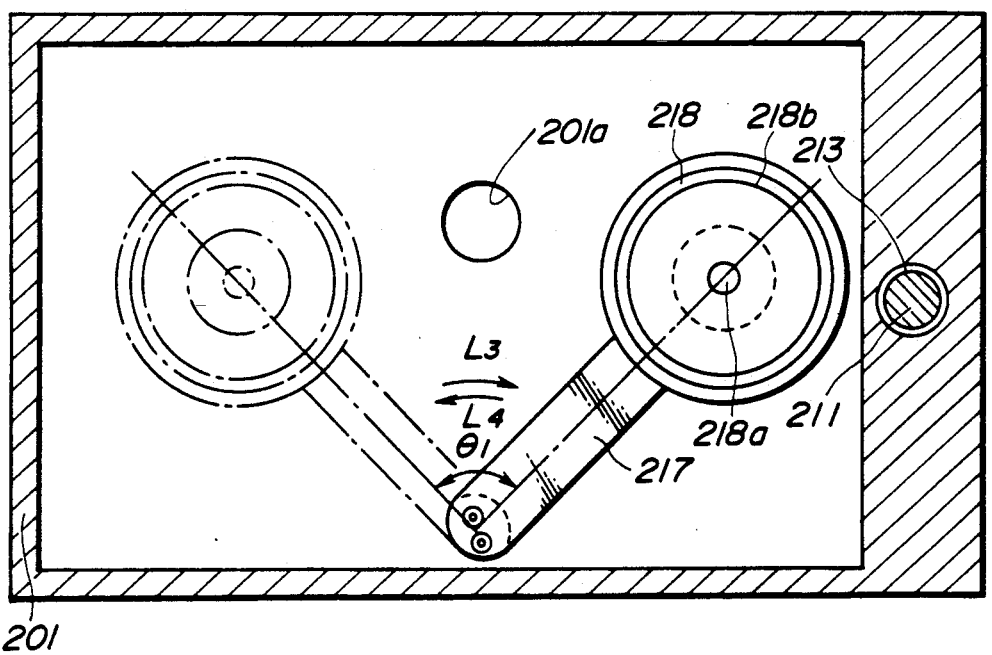
FIG. 16 is a cross-sectional view of the vacuum chamber.

The vacuum chamber 201 is evacuated by the vacuum pump so that the inner pressure is maintained at a given vacuum pressure and has at the substantially central part thereof a duct 201a connected with the vacuum pump as shown in FIGS. 15 and 16.

A disc entrance and exit opening 202 through which untreated and treated disc substrates are loaded and unloaded is juxtaposed with a sputtering treatment portion 203 in which sputtering treatments are performed to the disc substrates on the upper side of the vacuum chamber 201.

The disc entrance and exit opening 202 is formed as a supply opening through which untreated and treated disc substrates are loaded and unloaded to and from the vacuum chamber 201, respectively, and is formed into a substantially circular shape having a diameter larger than the outer dimension of the disc substrates depending upon the shape of the disc substrates. A lid 204 which is capable of opening and closing the disc entrance and exit opening 202 is provided thereabove.

The lid 204 is formed in such a dimension that it is capable of closing the disc entrance and exit opening 202 and has at the opposite sides thereof sides 204a and 204b which close the disc entrance and exit opening 202. The closing sides 204a and 204b are circular faces having areas sufficient to close the disc entrance and exit opening 202. The outer peripheral edge of the closing side 204a or 204b is brought into contact with the peripheral edge of the disc entrance and exit opening 202 for closing the opening 202. Seal members 205 and 206, such as O-rings, are provided on the closing sides 204a and 204b of the lid 204 in the vicinity of the outer peripheral edge thereof to contact with the peripheral edge of the opening 202 for keeping an airtightness in the vacuum chamber 201.

Stepped circular sides 207 and 208 having such a dimension that they can be located inside of the disc entrance and exit opening 202 are formed on the closing sides 204a and 204b of the lid 204, respectively, at the substantial center thereof. Holding means including suction pads 207a and 208a for sucking the disc substrates are provided on the stepped sides 207 and 208. These stepped sides 207 and 208 are provided to reduce the distance between the suction pads 207a and 208a and a tray 218 which will be described hereafter for positively sucking the disc substrate on the tray 218 by the sucking pads 207a and 208a.

The thus formed lid 204 is mounted on a rotary shaft 210 of a drive device 209 including a motor or the like and may be reversed as is represented by arrow Y in FIG. 15. That is, the lid 204 may be rotated together with the rotary shaft 210 by the lid 204 fixed to the rotary shaft 210 by a bolt threadably engaged with the shaft 210 at the top end thereof. The shaft 210 extends through a through-hole (not shown) in the lid 204 extending in a diametrical direction at a mid-level of the thickness of the lid 204. Accordingly, the lid 204 is driven by the operation of the drive device 209 so that the opposed closing sides 204a and 204b are rotated by 180° to be reversed.

The lid 204 is supported in such a manner that it is movable in a vertical direction with respect to the disc entrance and exit opening 202. That is, the lid 204 is mounted on the top end of a support shaft 211 of a drive device, such as an air cylinder (not shown), projecting from the bottom of the vacuum chamber 201 via a connecting member 212 so that it is movable in a vertical direction as represented by arrow C in the drawing. The drive device is provided on the lower side of the vacuum chamber 201. The support shaft 211 of the drive device is disposed in a through-hole extending through the vacuum chamber 201 in the height direction in the vicinity of the disc entrance and exit opening 202. Accordingly, it can be expected that the apparatus becomes more compact in size. For example, bearings 213 and the like are press-inserted into the through-hole through which the support shaft 211 extends for making the sliding of the support shaft 211 easier.

The lid 204 which is supported as is mentioned above is moved toward the vacuum chamber 201 to pressure-contact the peripheral edge of the disc entrance and outlet opening 202 for closing the disc entrance and outlet opening 202 with one of the closing sides, e.g. 204a , and to suck the sputter-treated disc substrate resting upon the tray 218 by means of suction pads 207a. The lid 204 is moved away from the vacuum chamber to remove the treated disc substrate from the vacuum chamber 201 and to open the disc entrance and exit opening 202. The lid 204 is reversed while the lid 204 is elevated so that an untreated disc substrate sucked to the other closing side 204b will face the disc entrance and exit opening 202.

The sputtering treatment portion 203 comprises a disc treatment opening 214 which is formed similarly to the disc entrance and exit opening 202. A treatment portion 215 keeps the inner pressure in the vacuum chamber 201 at an evacuated pressure and is mounted on the vacuum chamber 201 to cover the upper side of the disc treatment opening 214. The treatment portion comprises a cylindrical enclosure having a closed upper end and is charged with a metal material (target) 216 used for sputtering and a low pressure discharging gas, such as argon, which is necessary for sputtering treatment. A desired electrostatic field is established in the treatment portion 215.

A swing arm 217 forming a carrying means for shifting the disc substrate between the disc entrance and exit opening 202 and the sputtering treatment portion 203 is provided in the vacuum chamber 201. The swing arm 217 is disc-shaped only at the free end on which the disc substrate rests and is tapered at the base end. The swing arm 217 is bolted at the tapered end thereof to the top end of the rotary shaft 218 which projects upward in the vacuum chamber 201 and is swung around the axis thereof in directions represented by arrows $L_3$ and $L_4$ in FIG. 16 by a drive device (not shown). For example, the swing arm 217 is swung over an angle of about 90° represented by $\theta_1$ in FIG. 16 for carrying of the disc substrates between a position below the disc entrance and exit opening 202 and a position below the sputtering treatment portion 203.

A circular positioning recess 217a on which tray 218 for a disc substrate rests is formed on the upper side of the swing arm 217 at the free end thereof. A through-hole 217b is bored in the center of the recess 217a. Push up rods 219 and 220 which will be described hereafter extend through the hole 217b. The tray 218 on which the disc substrate rests is adapted to fit into and is placed upon the recess 217a. The tray 218 is formed of a disc having a diameter slightly larger than the outer dimension of the disc substrate. A projection 218a for positioning the disc substrate by extending through a chucking centering hole of the disc substrate is provided in the center of the tray 218. Accordingly, the disc substrate is positioned with respect to the swing arm 217 while it is fixed to the tray 218 adapted to the positioning recess 217a. A seal member 218b, such as an O-ring, is attached to the peripheral edge of the tray 218 so that airtightness in the vacuum chamber 201 is maintained when the tray 218 upwardly pressure-contacts the peripheral edge of the disc entrance and exit opening 202 at the peripheral edge thereof.

The push up rods 219 and 220 are provided at the bottom of the vacuum chamber 201. The rods 219 and 220 are vertically movable toward and away from the disc entrance and exit opening 202 and the disc treatment opening 214 in a direction represented by arrows E and F in FIG. 15, by a drive device (not shown) provided with control means (not shown). The push rods 219 and 220 extend to the inside of the vacuum chamber 201 through through-holes (not shown) bored in the bottom of the vacuum chamber 201 and face the disc entrance and exit opening 202 and the disc treatment opening 214, respectively. Disc-like push up members 219a and 220a for stable upward pushing of the tray 218 via the hole 217b bored in the swing arm 217 are secured to the top ends of the push up rods 219 and 220.

The push up rods 219 and 220 are urged upward when the top end of the swing arm 217 faces the disc entrance and exit opening 202 and the disc treatment opening 214, respectively. In other words, the tray 218 resting on the swing arm 217 is raised by the push up rod 219 and 220 extending through the hole 217b provided in the swing arm 217 at the disc entrance and exit opening 202 and the disc treatment opening 214 and is brought into pressure-contact with the peripheral edge of the disc entrance and exit opening 202 and the disc treatment opening 214. Since the seal member 218b, such as an O-ring, is provided along the peripheral edge of the tray 218, a more positive sealing relation between the vacuum chamber 201 and the atmosphere is assured.

Figure 17:
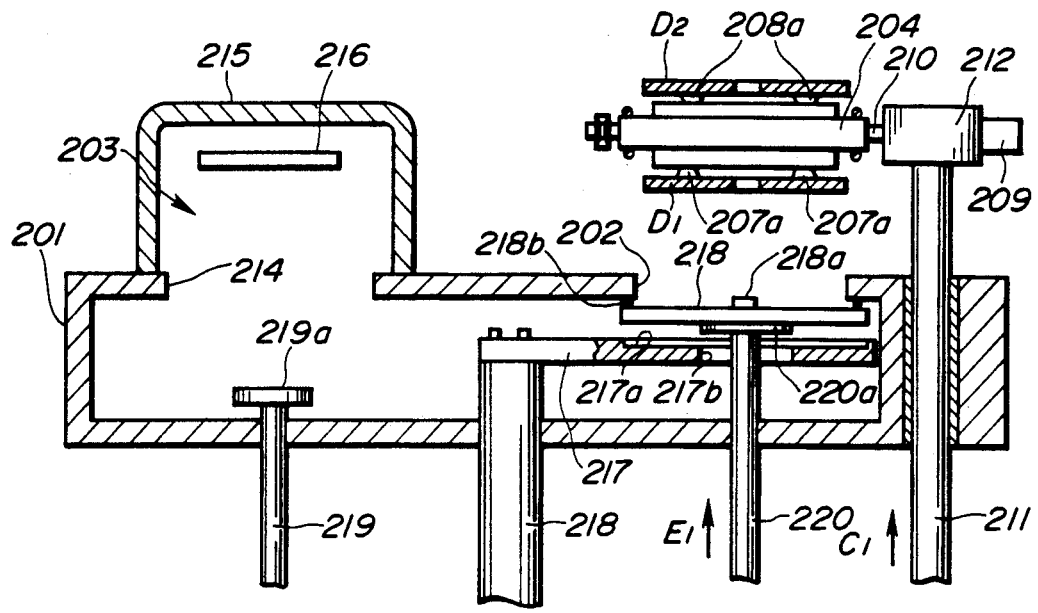
FIGS. 17 through 25 are longitudinal sectional views sequentially showing the sputtering process performed by the optical disc manufacturing apparatus of the present embodiment.

The optical discs are manufactured by the above optical disc manufacturing apparatus as follows:

The tray 218 resting upon the swing arm 217 is first raised upwardly by pushing the push up rod 220 facing the disc entrance and exit opening 202 in the direction of arrow $E_1$ in the drawing toward the disc entrance and exit opening 202 as shown in FIG. 17 so that the peripheral edge of the tray 218 is brought into pressure-contact with the peripheral edge of the disc entrance and exit opening 202.

The disc entrance and exit opening 202 is then closed by the tray 218. since the tray 218 is provided with a seal member 218b at the peripheral edge thereof, the inside of the vacuum chamber 201 is sealed from the atmosphere so that the atmosphere is prevented from penetrating into the inside of the vacuum chamber 201.

The lid 204 is then separated from the vacuum chamber 201 by moving the support shaft 211 for vertically moving the lid 204 in the direction of arrow $C_1$ so that the upper side of the tray 218 is exposed through the disc entrance and exit opening 202.

Untreated disc substrate $D_1$ is then sucked to the pads 207a located on the lower side of the pad 208a provided on the upper side of the lid 204, respectively.

Figure 18:
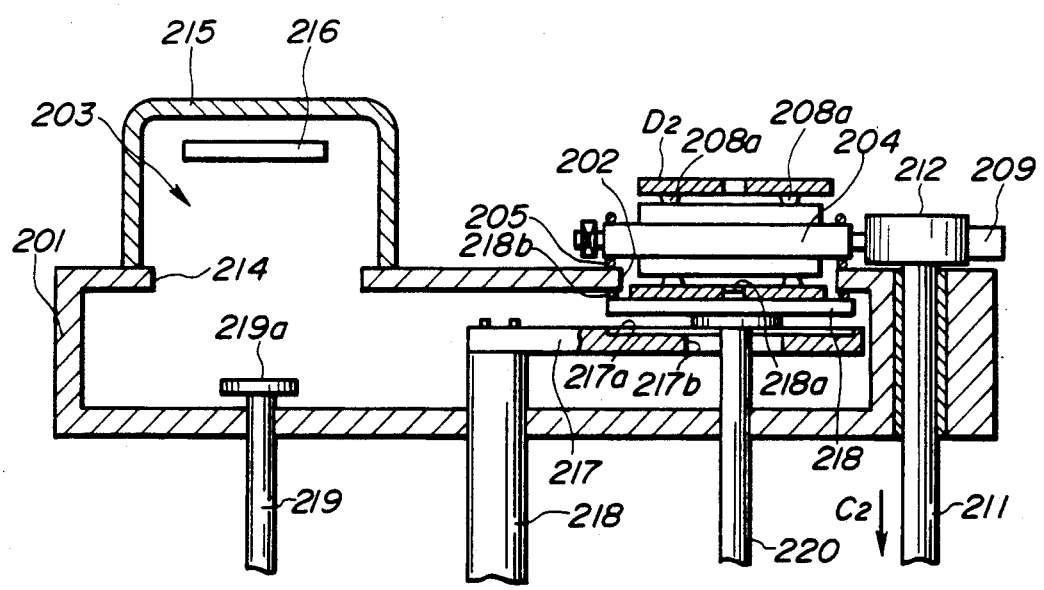

The support shaft 211 is subsequently lowered into the bottom of the vacuum chamber 201 in the direction of arrow $C_2$ in FIG. 18 to lower the lid 204 toward the disc entrance and exit opening 202 for closing the disc entrance and exit opening 202 with one of the closing sides 204a of the lid 204.

As a result of this, the inside of the vacuum chamber 201 is sealed from the atmosphere. Although the drawing is exaggeratedly drawn as if sealing is achieved by only the seal member 205 provided on the lid 204, the closing side 204a is practically in close-contact with the peripheral edge of the disc entrance and exit opening 202.

The disc substrate $D_1$ sucked to one of the closing sides 204a of the lid 204 is placed upon the tray 218 under this condition.

At this time, the disc substrate $D_1$ is positioned in place by means of the projection 218a provided in the substantial center of the tray 218.

Figure 19:
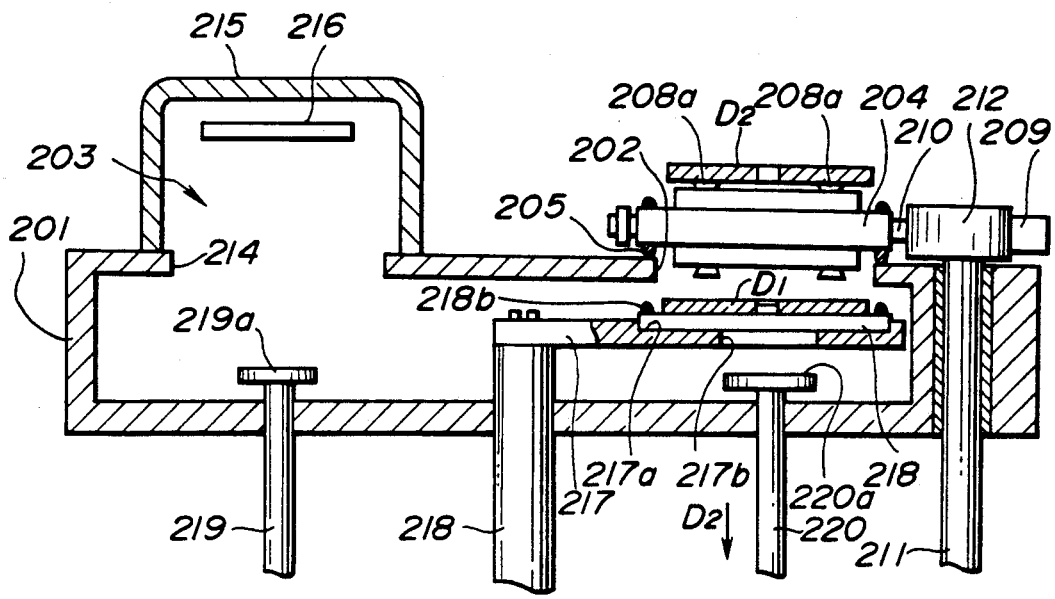

The vacuum degree which has been lost by the opening and closing operation of the disc entrance and exit opening 202 is recovered by operating the vacuum pump while the disc entrance and exit opening 202 is closed by the lid 204 as shown in FIG. 19. Simultaneously with this, the tray 218 is placed upon the recess 217a of the swing arm 217 by moving the push up rod 220 in the direction of arrow $D_2$ to move the tray 218 downwardly.

Since only one swing arm 217 is provided in the present embodiment of the vacuum chamber 201, there is no obstacle for evacuation. Accordingly, a given vacuum degree can be reached rapidly, for example, in no longer than one second.

Figure 20:
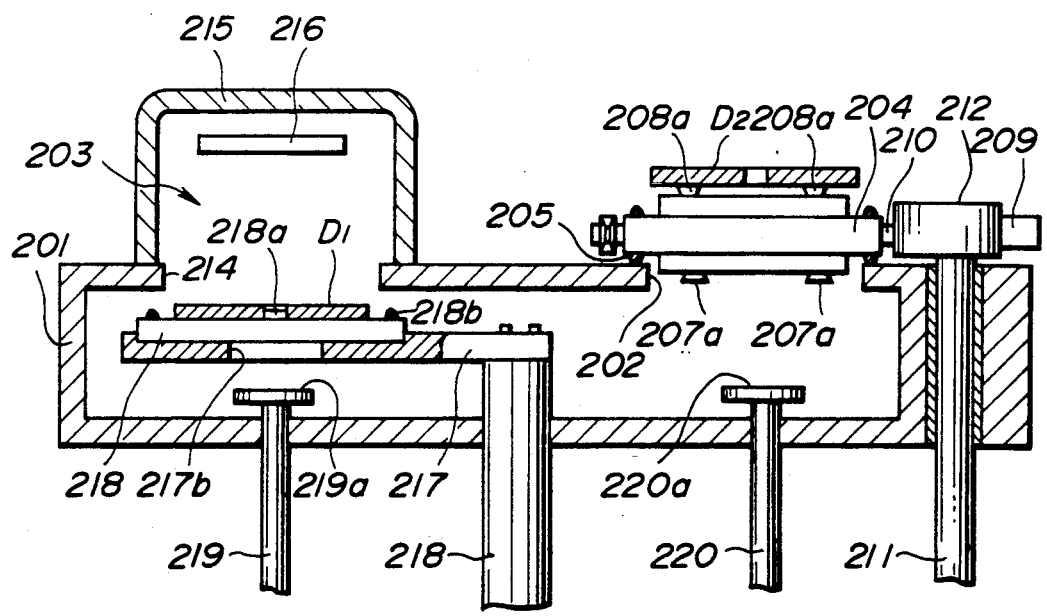

After the tray 218 has been placed upon the top end of the swing arm 217, the swing arm 217 is swung to the sputtering treatment portion 203 in the direction of arrow $L_4$ in FIG. 16 so that the disc substrate $D_1$ resting upon the tray 218 is positioned below the disc treatment opening 214 as shown in FIG. 20.

Figure 21:
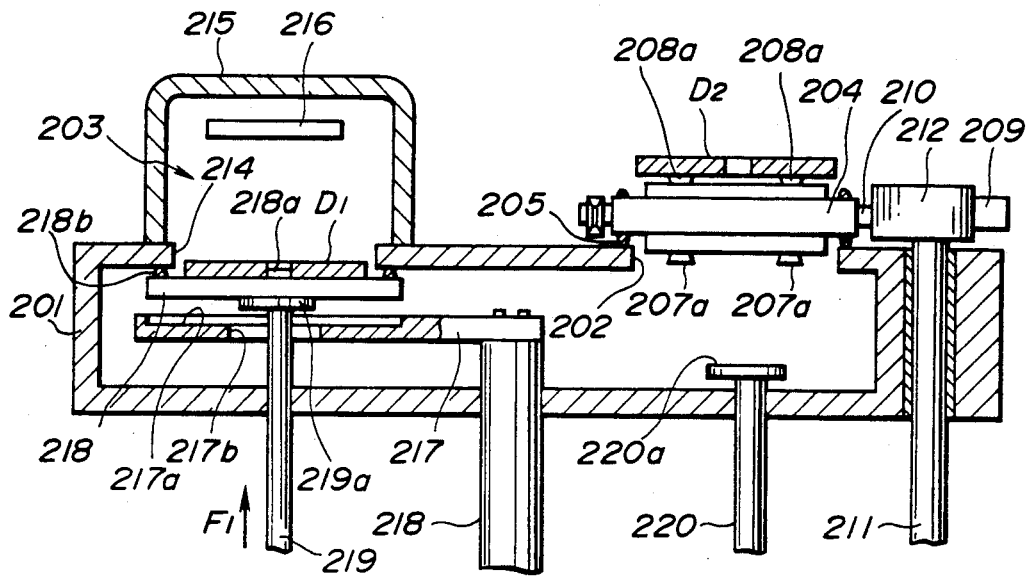

After the positioning of the tray 218 has been completed, the push up rod 219 provided below the tray 218 is extended toward the disc treatment opening 214 in the direction of arrow $F_1$ for bringing the peripheral edge of the tray 218 into pressure-contact with the peripheral edge of the disc treatment opening 214 as shown in FIG. 21.

As a result of this, the disc treatment opening 214 is closed by the tray 218. Under this condition, sputtering of the disc substrate $D_1$ is commenced.

Figure 22:
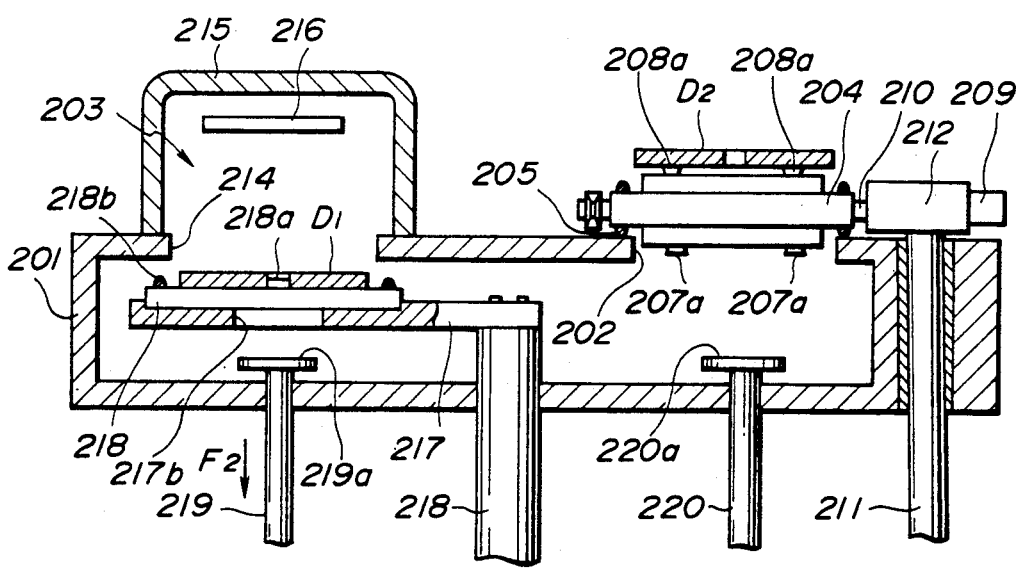

After the sputtering treatment has been completed, the push up rod 219 is lowered in the direction of arrow $F_2$ shown in FIG. 22 so that the tray 218 on which the disc substrate $D_1$ rests is placed upon the swing arm 217.

Figure 23:
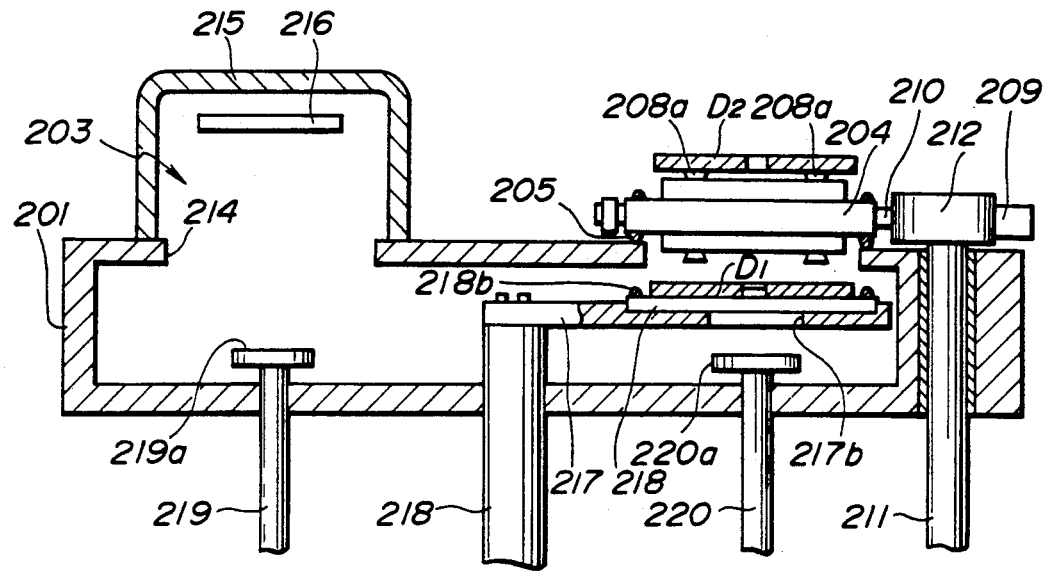

After the disc substrate $D_1$ is placed upon the swing arm 217, the swing arm 217 is swung to the disc entrance and exit opening 202 in the direction of arrow $L_3$ in FIG. 16 so that the tray 218 on which is placed the disc substrate $D_1$ with a thin film of aluminum formed thereon is positioned below the disc entrance and exit opening 202 a shown in FIG. 23.

Figure 24:
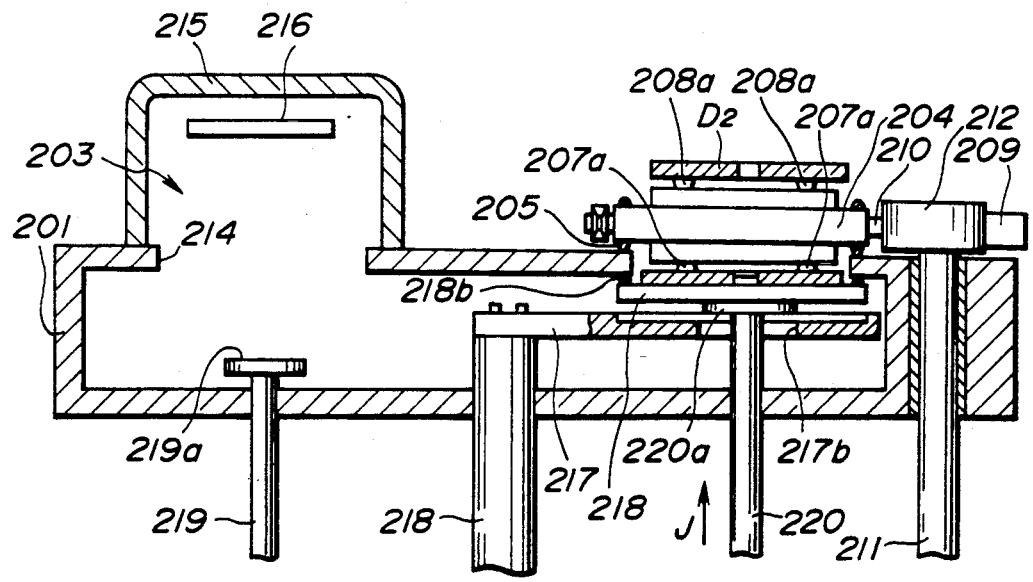

With the tray 218 thus positioned, the push up rod 220 is then pushed up toward the disc entrance and exit opening 202 in the direction of arrow J as shown in FIG. 24 to move the tray 218 upwardly so that the tray 218 closes the disc entrance and exit opening 202.

The sputter-treated disc substrate $D_1$ is sucked by the suction pads 207a provided on the lid 204 which has closed the disc entrance and exit opening 202.

Subsequently, the support rod 211 for vertically moving the lid 204 is pushed upward in the direction of arrow K in FIG. 25 to separate the lid 204 from the vacuum chamber 201, and then the lid 204 is reversed in the direction of arrow L while the support rod 211 is elevated to change the closing side 204b facing the disc entrance and exit opening 202. That is, an untreated disc substrate $D_2$ sucked to the other suction pad 208a is then caused to face the disc entrance and exit opening 202, and the sputter-treated disc substrate $D_1$ is reversed to the side opposite the opening 202.

Figure 25:
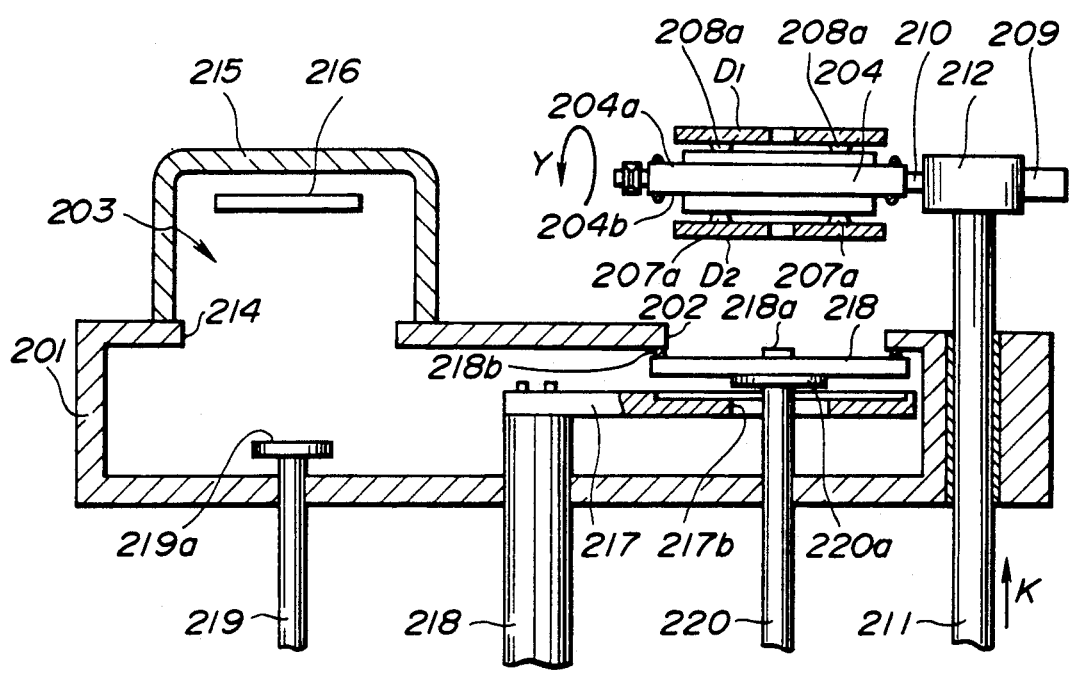

Subsequently, as mentioned above, the support rod 211 is immersed into the vacuum chamber 201 side as shown in FIG. 25 to close the disc entrance and exit opening 202 by the lid 204. After sequentially performing the above-mentioned steps, the untreated new disc substrate $D_2$ is sputter-treated.

While the new disc substrate $D_2$ is sputter-treated, the treated disc substrate $D_1$ sucked to the closing side 204a opposite to the disc entrance and exit opening 202 is removed, and an untreated new disc substrate is sucked to the sucking pads 207a provided on the closing side 204a. Since this operation can be carried out during sputtering treatment, there is sufficient time for the change-over. Therefore, the present apparatus is very advantageous for automation of the sputtering treatment.

If the optical discs are manufactured by using the optical disc manufacturing apparatus of the present embodiment in such a manner, loading and unloading of untreated and treated substrates to and from the vacuum chamber 201 can be achieved rapidly, and remarkable enhancement of productivity can be expected. For example, the period of time required for manufacturing an optical disc is about 6 seconds, and loading and unloading of the disc substrates to and from the vacuum chamber 201 is completed within only 0.5 second. Accordingly, remarkable shortening of the period of time can be expected, and the other treatments can be carried out within a sufficient period of time, for example 5.5 seconds.

Although the lid 204 for holding members to be treated is a two-sided body provided with closing sides 204a and 204b in the optical disc manufacturing apparatus in which the present invention is embodied, the lid 204 may be a polygon, such as a three, four, five or more sided body, without being limited to a two-sided body.

What is claimed is:

1. A sputtering apparatus, comprising:
   a vacuum chamber having a supply opening through which a member to be sputter-treated is loaded and unloaded and a sputtering-treatment portion;
   means for closing said supply opening;
   a tray on which the member to be sputter-treated is placed, wherein said tray is provided with an opening at the substantial center thereof;
   lifting means for raising and lowering said tray at the positions of said sputtering-treatment portion and said supply opening, wherein said lifting means includes a push-up rod which is controlled to be raised and lowered, and a closing portion which closes the opening of said tray from the lower side thereof when said tray is raised by said push-up rod; and
   carrying means for carrying said member between said supply opening and said sputtering treatment portion while the member to be treated is placed upon said tray in the vacuum chamber, whereby said supply opening of said vacuum chamber is closed by said means for closing during the sputtering treatment, and said supply opening of said vacuum chamber is closed by said tray which is raised by said lifting means.

2. A sputtering apparatus as defined in claim 1 in which said push up rod is adapted to raise and lower said tray via said carrying means.

3. A sputtering apparatus as defined in claim 1 in which said closing means has a plurality of closing sides which are provided with holding means for holding the members to be sputter-treated.

4. A sputtering apparatus as defined in claim 3 in which said closing means is provided so that it can be raised and lowered between a position in which it closes said supply opening and a position above said supply opening.

5. A sputtering apparatus as defined in claim 4 in which said closing means is raised and lowered while said supply opening is closed by said tray.

6. A sputtering apparatus as defined in claim 3 in which said closing means is adapted to select any one of the plurality of closing sides.

7. A sputtering apparatus as defined in claim 6 in which said selection of the closing sides is performed while said supply opening is closed by said tray.

8. A sputtering apparatus as defined in claim 8 in which the plurality of closing sides are provided so that they are rotatable with respect to said closing means.

9. A sputtering apparatus as defined in claim 1 in which said tray is provided with positioning means for positioning the member to be sputter-treated resting upon said tray.

10. A sputtering apparatus, comprising;
a vacuum chamber having a supply opening through which a member to be sputter-treated is loaded and unloaded and a sputtering-treatment portion;
closing means having a plurality of closing sides provided with holding means for holding the member to be sputter-treated for closing said supply opening by any one of the plurality of closing sides; and
carrying means for carrying a tray between said supply opening and said sputtering treatment portion in the vacuum chamber.

11. A sputtering apparatus as defined in claim 10 in which said closing means is provided so that it can be raised and lowered between a position in which it closes said supply opening and a position above said supply opening.

12. A sputtering apparatus as defined in claim 11 in which said closing means is raised and lowered while said supply opening is closed by said tray.

13. A sputtering apparatus as defined in claim 10 in which said closing means is adapted to select any one of the plurality of closing sides, such that closing of said supply opening when a sputtering treatment of the member to be sputter-treated is performed in said sputtering treatment portion.

14. A sputtering apparatus as defined in claim 13 in which said selection of said closing sides is performed while said supply opening is closed by said tray of said carrying means on which the member to be sputter-treated rests.

15. A sputtering apparatus as defined in claim 10 in which said carrying means comprises an arm member which is swingable between said sputtering treatment portion and said supply opening and a tray which is carried by said arm member and on which said member to be sputter-treated rests.

* * * * *